(12) United States Patent
Lee et al.

(10) Patent No.: US 7,842,566 B2
(45) Date of Patent: Nov. 30, 2010

(54) FINFET AND METHOD OF MANUFACTURING THE SAME

(75) Inventors: Deok-Hyung Lee, Seoul (KR);
Sun-Ghil Lee, Yongin-si (KR);
Jong-Ryeol Yoo, Osan-si (KR);
Si-Young Choi, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 234 days.

(21) Appl. No.: 12/000,071

(22) Filed: Dec. 7, 2007

(65) Prior Publication Data
US 2008/0135888 A1 Jun. 12, 2008

(30) Foreign Application Priority Data
Dec. 8, 2006 (KR) .................. 10-2006-0124950

(51) Int. Cl.
*H01L 21/8234* (2006.01)
(52) U.S. Cl. .................. 438/197; 257/E21.433
(58) Field of Classification Search .................. 438/197; 257/E21.433
See application file for complete search history.

(56) References Cited

U.S. PATENT DOCUMENTS

| 7,071,048 | B2 | 7/2006 | Son et al. |
| 7,381,649 | B2 * | 6/2008 | Chen et al. .................. 438/700 |
| 2005/0035415 | A1 * | 2/2005 | Yeo et al. .................. 257/401 |
| 2005/0199920 | A1 * | 9/2005 | Lee et al. .................. 257/288 |
| 2005/0224890 | A1 | 10/2005 | Bernstein et al. |
| 2006/0044915 | A1 | 3/2006 | Park et al. |

FOREIGN PATENT DOCUMENTS

| KR | 10-2005-0041704 | 5/2005 |
| KR | 10-2006-0020938 | 3/2006 |

* cited by examiner

*Primary Examiner*—Lex Malsawma
*Assistant Examiner*—Elias Ullah
(74) *Attorney, Agent, or Firm*—Lee & Morse, P.C.

(57) ABSTRACT

A FinFET may include a semiconductor fin having a top surface and a sidewall having different crystal planes. A gate dielectric layer on the top surface and on the sidewall has different thicknesses. A gate electrode is formed on the gate dielectric layer across the top surface and sidewall of the semiconductor fin.

13 Claims, 15 Drawing Sheets

First Direction  Second Direction

First Direction   Second Direction

First Direction     Second Direction

FINFET AND METHOD OF MANUFACTURING THE SAME

BACKGROUND

1. Field of the Invention

Embodiments relate to a semiconductor device and a method of manufacturing the same. More particularly, embodiments relate to a fin field effect transistor (FinFET) and a method of manufacturing the same.

2. Description of the Related Art

A vast amount of research has lately been conducted on nano-CMOS device technology worldwide because the nano-CMOS device technology can be applied to logic circuits, such as a central processing unit (CPU), and memories to create high value-added products. With the downscaling of systems using silicon semiconductor technology and the increased demand for low power consumption, devices also need to shrink. Presently, the on-going downscaling in the gate size of devices gives rise to problems with, especially, a short channel effect (SCE).

Conventional CMOS technology involves forming CMOS devices on a bulk silicon substrate. When a MOS device formed on a bulk silicon substrate has a gate length of 50 nm or less, the characteristics of the MOS device are greatly affected by process conditions. A MOS device having a channel length of near 30 nm may still be insufficient for an actual circuit in terms of performance. Furthermore, an area occupied by a single actual device does not shrink due to an unreduced space region formed beside a gate, compared with a conventional device, so that the integration density of the device is not greatly improved.

Owing to a technical limit in MOS device technology based on a bulk silicon substrate, laborious research into a device formed on a silicon-on-insulator (SOI) substrate has progressed in order to form devices having a channel length of 30 nm or less. There have been extensive studies on the characteristics of a conventional device structure formed on a SOI substrate instead of a bulk silicon substrate. In the device structure formed on the SOI substrate, a parasitic source/drain resistance greatly increases due to the silicon layer having a small thickness, so that separate selective formation of an epitaxial layer in source and drain regions may be needed. Also, since a body of a SOI device is not connected to the substrate, the performance of the SOI device, for example, a floating body effect and thermal conductivity, may be degraded.

As described above, when a conventional device structure is formed on a SOI substrate, a SOI device is not appreciably shrunk compared with a conventional device based on a bulk silicon substrate. To solve this problem, a tri-gate structure or a dual-gate structure has been proposed to reduce a channel length of a CMOS device to 25 nm or less. The tri-gate structure or dual-gate structure is typically called a fin field effect transistor (FinFET). More specifically, when a channel region is formed on a protruding pattern, called a fin, having three surfaces (i.e., a top surface and two sidewalls) on a bulk silicon substrate, a tri-gate FinFET is obtained. Also, when a capping layer is formed on the fin of the tri-gate FinFET to cut off a vertical gate field effect and a channel region is formed on two surfaces (i.e., both sidewalls) of the fin, a dual-gate FinFET is manufactured.

In the foregoing FinFETs, since a gate electrode is formed on several surfaces of a channel region to which current is supplied, the channel region can be effectively controlled by the gate electrode. Thus, a leakage current flowing between source and drain regions can be greatly reduced compared with the conventional case, thereby markedly improving a drain induced barrier lowering (DIBL) effect. Furthermore, the gate electrode is formed on both sides of the channel region so that the threshold voltage of a device can be dynamically changed. As a result, the on-off characteristics of the channel region can be notably enhanced compared with a single gate structure, and the occurrence of an SCE can be inhibited. Therefore, further advances in FinFET devices and manufacture are desired.

SUMMARY OF THE INVENTION

Embodiments are therefore directed to a semiconductor device and a method of manufacturing the same, which overcome one or more of the problems of the related art.

In an exemplary embodiment, a semiconductor device may include a semiconductor fin having a top surface and a sidewall oriented on different crystal planes, a gate dielectric layer having a first portion on the sidewall of the semiconductor fin and a second portion on the top surface of the semiconductor fin, the second portion being thicker than the first portion, and a gate electrode on the first and second gate dielectric layers.

In an exemplary embodiment, a method may include forming a semiconductor fin having a top surface and a sidewall with different crystal planes, forming a gate dielectric layer including a first portion on the sidewall of the semiconductor fin and a second portion on the top surface, the second portion being thicker than the first portion, and forming a gate electrode on the first and second portions.

In an exemplary embodiment, a method may include: etching a semiconductor substrate to form a semiconductor fin having a top surface and a sidewall with different crystal planes such that a thermal oxide layer is grown to different thicknesses; thermally oxidizing the semiconductor substrate to form a first thermal oxide layer on the sidewall of the semiconductor fin and form a second thermal oxide layer on the top surface of the semiconductor fin, wherein the second thermal oxide layers is thicker than the second thermal oxide layer; and forming a gate electrode on the first and second thermal oxide layers.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION

Figure 1:
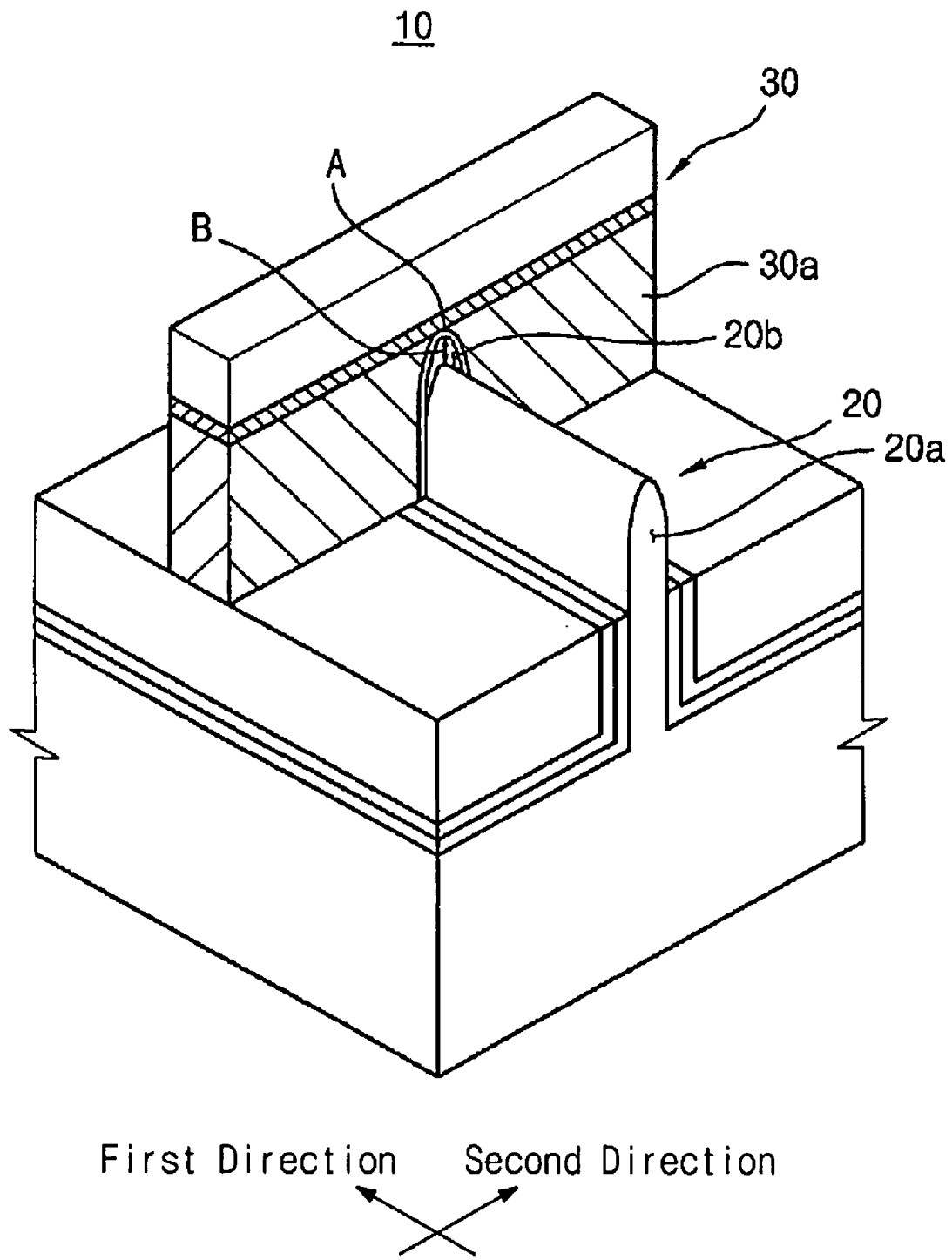
FIG. 1 illustrates a perspective view for explaining the problem of a tri-gate fin field effect transistor (FinFET)

Korean Patent Application 2006-124950, filed on Dec. 8, 2006, in the Korean Intellectual Property Office, and entitled: "FinFET and Method of Manufacturing the Same," is incorporated by reference herein in its entirety.

Embodiments will now be described more fully hereinafter with reference to the accompanying drawings, in which example embodiments are illustrated. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. It will also be understood that when a layer is referred to as being on or under another layer or substrate, it may be directly on or under the other layer or substrate, or intervening layers may also be present. Like numbers refer to like elements throughout.

FIG. 1 illustrates a perspective view for explaining the problem of a tri-gate fin field effect transistor (FinFET) 10.

Referring to FIG. 1, as the integration density of semiconductor devices increases, a width of a fin 20 of the tri-gate FinFET 10 decreases. After the fin 20 undergoes several processes, the shape of the fin 20 may become pointed (indicated as portion "A"). As a result, a vertical gate field may crowd the fin 20, thus lowering electrical characteristics, such as a subthreshold swing, a threshold voltage, and a subthreshold current leakage. Also, while a gate conductive layer 30a is being etched to form a gate electrode 30, the fin 20 that underlies the gate conductive layer 30a may be etched. Thus, a region where source and drain regions 30a of the fin 20 will be formed may be at a lower level than a region where a channel 20a will be formed (indicated as portion "B").

Figure 2:
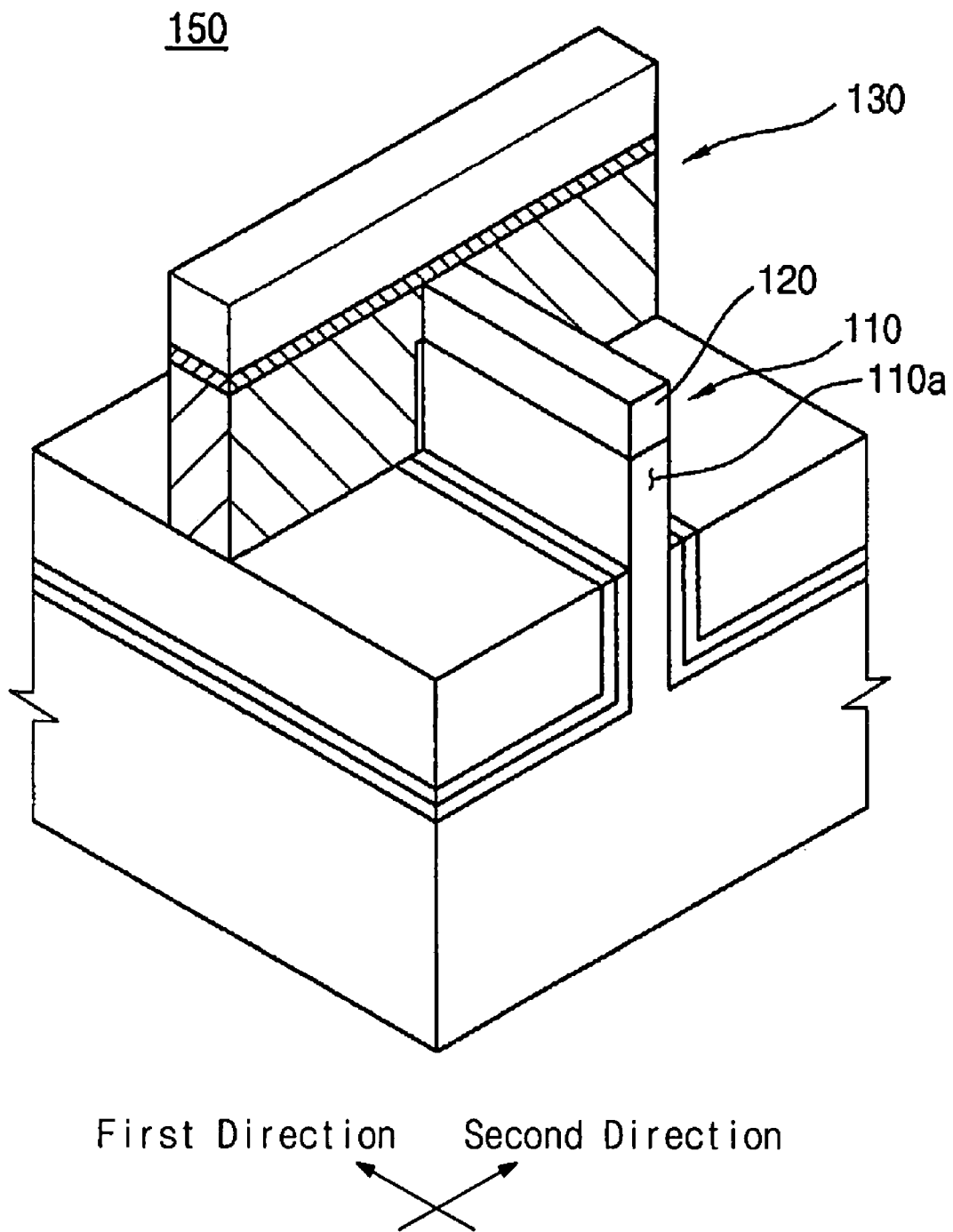
FIG. 2 illustrates a perspective view of a dual-gate FinFET.

In order to overcome the foregoing drawbacks, as illustrated in FIG. 2, a dual-gate FinFET 150 in which a capping layer 120 is formed on a fin 110 has been developed. Specifically, the capping layer 120 may be formed on a top surface of the fin 110 to inhibit the generation of a vertical gate field and keep an original shape of the fin 110. Also, the capping layer 120 may protect the fin 110 during an etching process for forming a gate electrode 130, thereby preventing or reducing etching of source and drain regions 110a.

Figure 3:
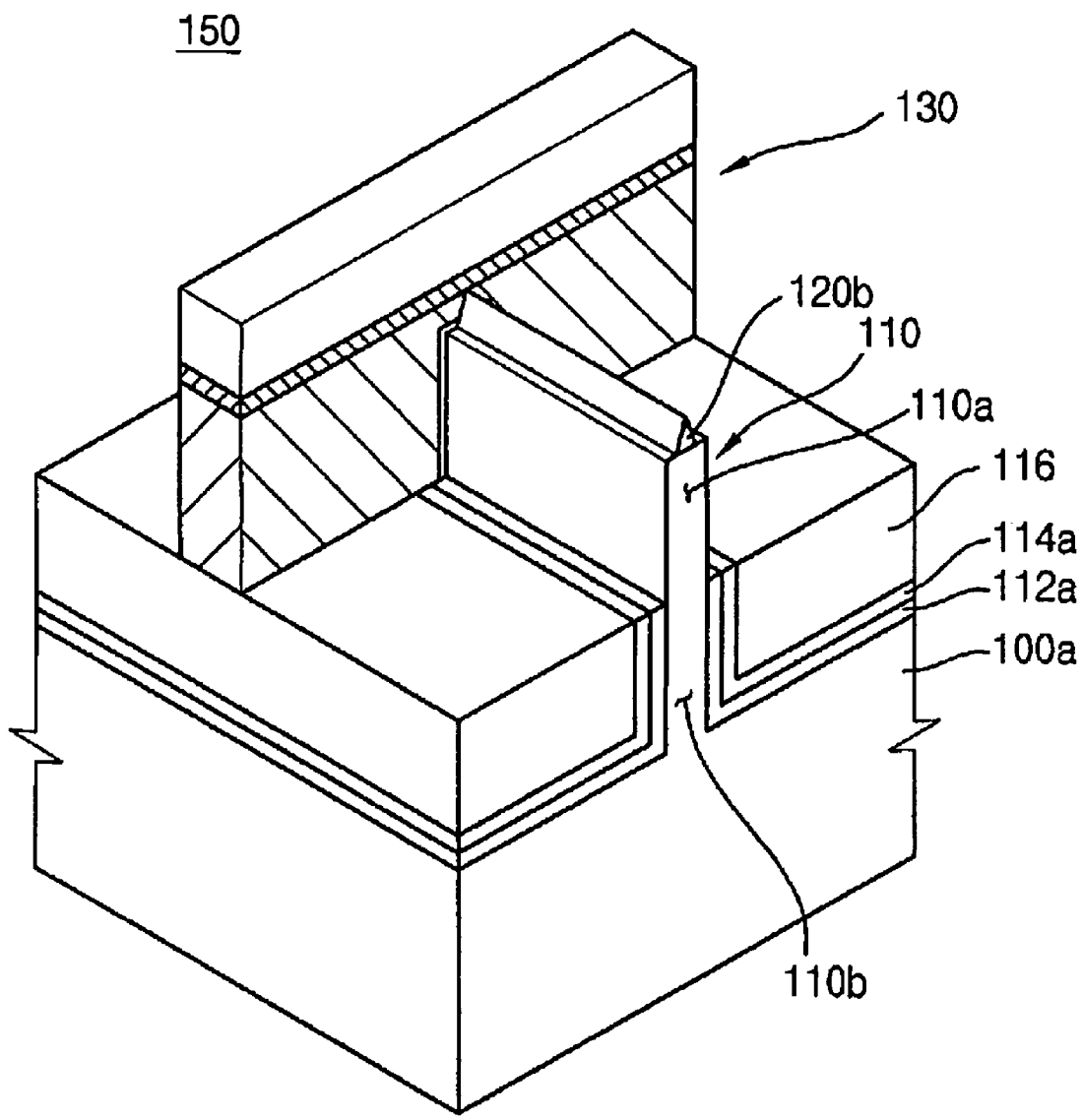
FIG. 3 illustrates a perspective view for explaining the problem of the dual-gate FinFET shown in FIG. 2.

However, even the capping layer 120 shown in FIG. 2 may be etched during several processes for forming a channel region. As a result, the capping layer 120 may be completely removed or a damaged capping layer 120b may be left, as illustrated in FIG. 3. The damaged capping layer 120a may not properly perform its functions, so that similar problems as those of the tri-gate FinFET described with reference to FIG. 1 are likely to occur.

The reason why the shape of the capping layer 120 may be damaged during the formation of the dual-gate FinFET 150 of FIG. 2 will now be described with reference to FIGS. 4 through 6.

Figure 4:
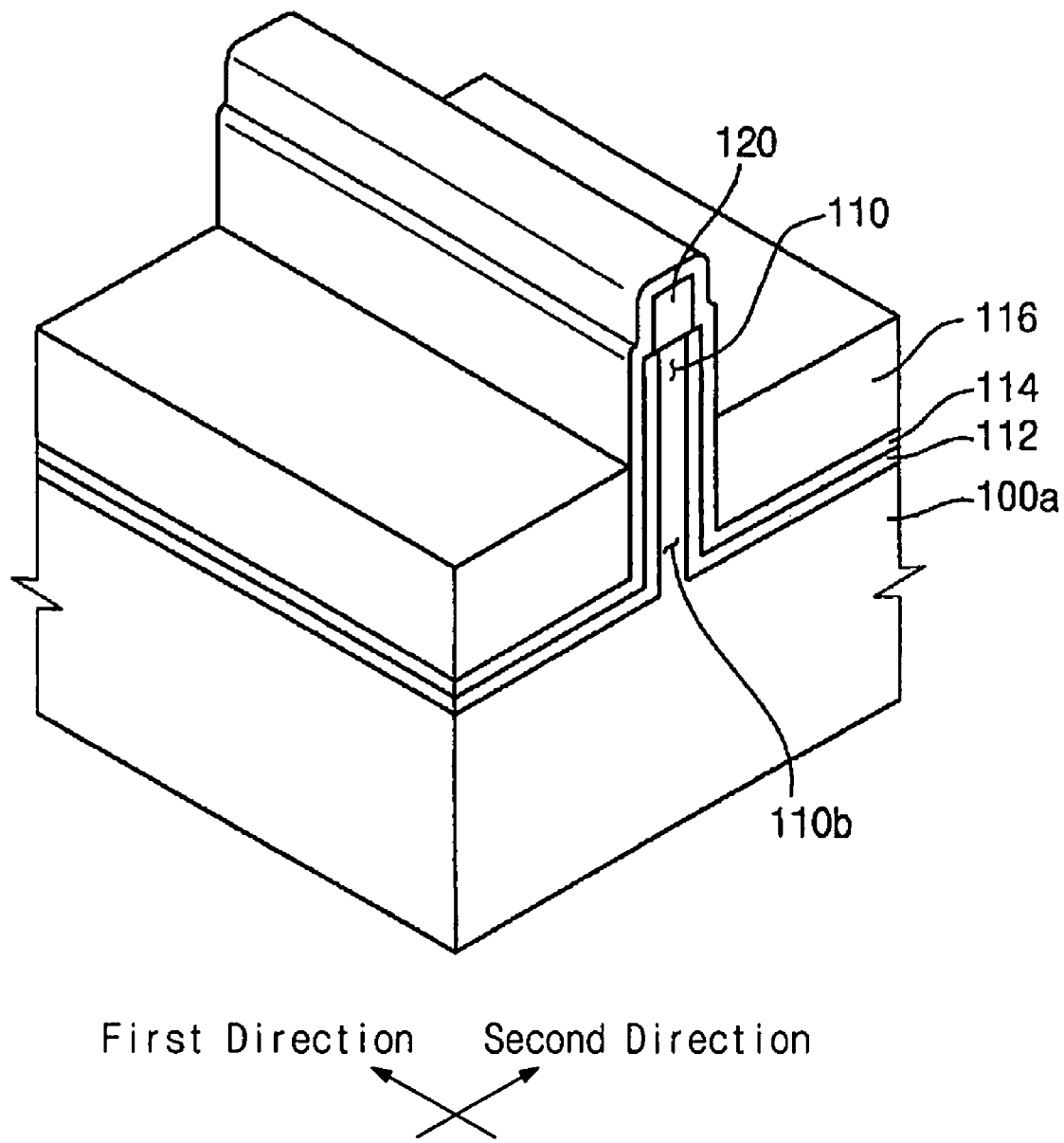
FIGS. 4 through 6 illustrate perspective views for explaining the problem of a method of manufacturing the dual-gate FinFET shown in FIG. 2.

Referring to FIG. 4, a silicon nitride layer is formed on a silicon substrate. The silicon nitride layer may be formed using a chemical vapor deposition (CVD) process. The silicon nitride layer may be patterned to form the capping layer 120. Thereafter, the silicon substrate may be etched using the capping layer 120 as an etch mask, thereby forming the fin 110 that protrudes from an etched silicon substrate 100a and extends in a first direction. In order to cure the damage of sidewalls of the fin 110 caused by the etching of the silicon substrate, a sidewall oxide layer 112 may be formed on the sidewalls of the fin 110 using a thermal oxidation process. A silicon nitride layer 114, which may serve as a liner, may be formed using a CVD technique to cover the sidewall oxide layer 112 and the capping layer 120 in order to prevent the oxidation of the sidewalls of the fin 110 during a subsequent process. Thereafter, a device isolation layer 116 may be filled from an upper surface of the silicon nitride layer 114 to a lower portion 110b of the fin 110, i.e., does not extend all the way up sidewalls of the fin 110.

Figure 5:
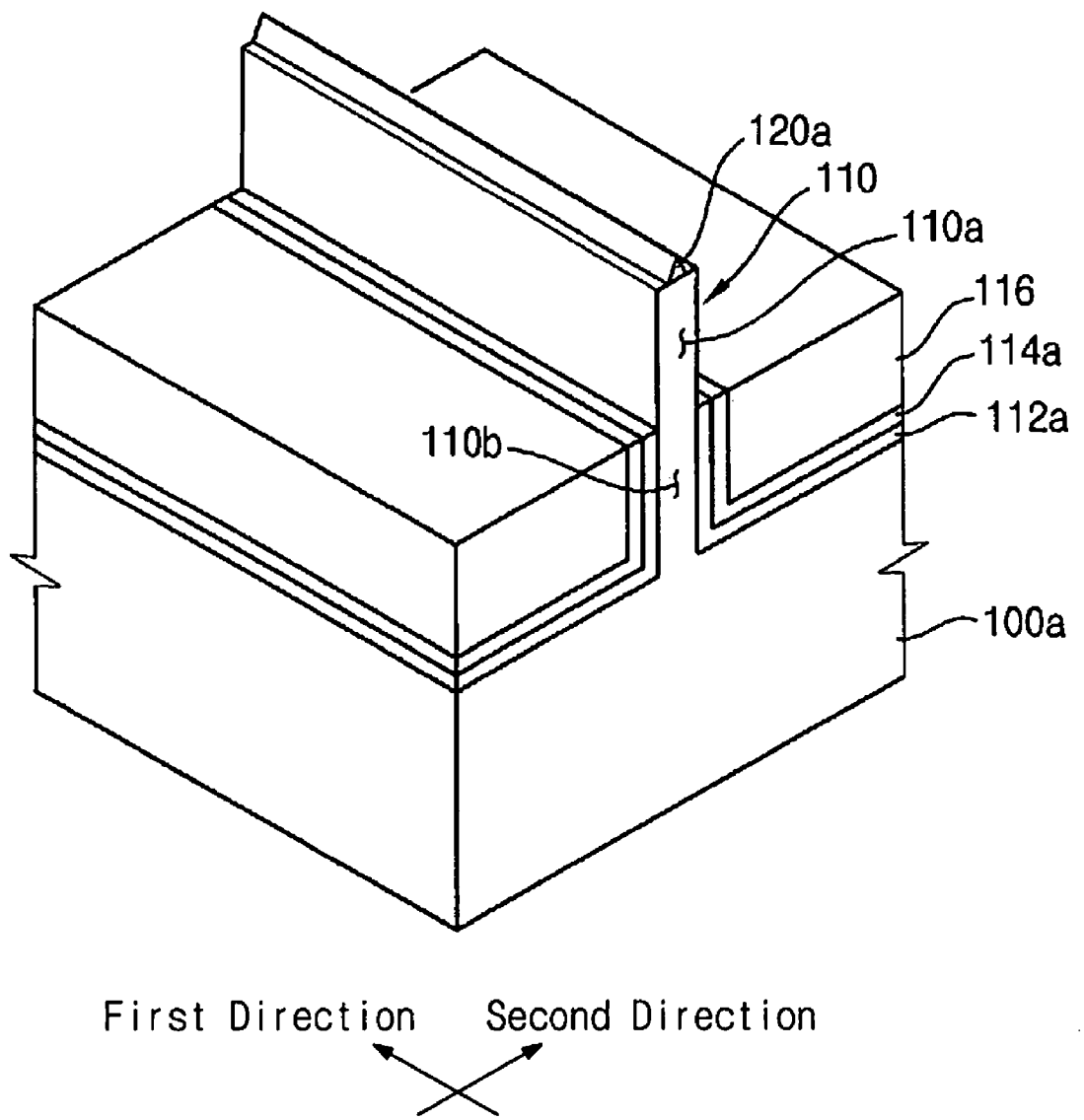

Referring to FIG. 5, to form a channel region, a portion of the silicon nitride layer 114, which is exposed by the device isolation layer 116, is etched to form a silicon nitride layer pattern 114a. The silicon nitride layer 114 may be etched using a phosphoric acid ($H_3PO_4$) solution. In this case, the capping layer 120, which may be the same layer as the silicon nitride layer 114 serving as the liner, may also be etched by the $H_3PO_4$ solution. Although it is possible to reduce the etched amount of the capping layer 120 by optimizing etching conditions using the $H_3PO_4$ solution, etching of the capping layer 120 to some extent is practically inevitable, since the capping layer 120 is exposed to the $H_3PO_4$ solution. Therefore, a deformed capping layer 120a may be formed as illustrated in FIG. 5 or the capping layer 120 may be completely removed.

Subsequently, the sidewall oxide layer 112 exposed by the silicon nitride layer pattern 114a may be etched to form a sidewall oxide layer pattern 112a. In this case, the sidewall oxide layer 112 is etched using a fluoric acid (HF) solution. Thus, an upper portion 110a of the fin 110 is exposed.

Figure 6:
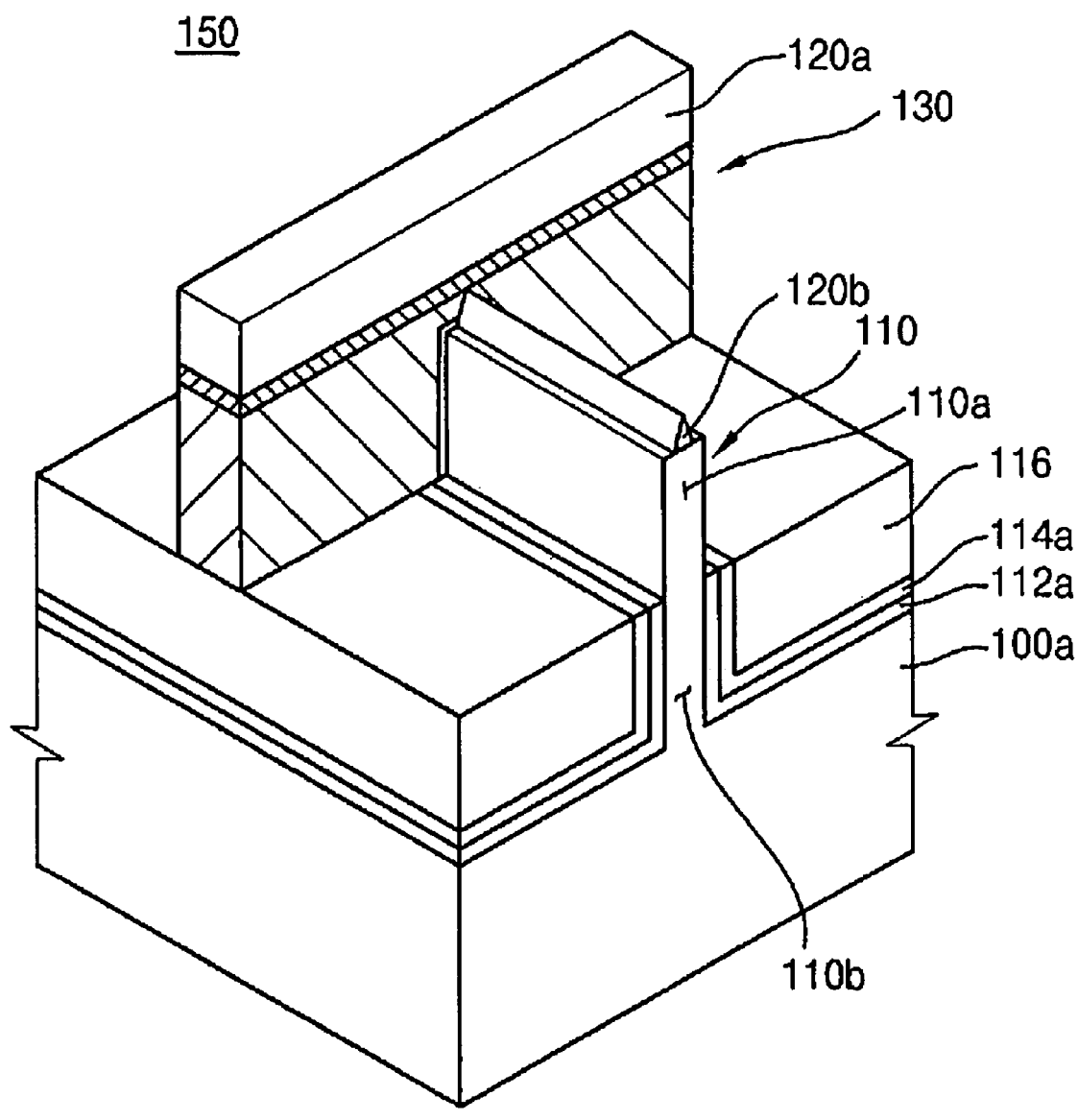

Referring to FIG. 6, a gate electrode 130 may be formed. The gate electrode 13 may enclose the upper portion 110a of the fin 110 exposed by the sidewall oxide layer pattern 112 and may extend in a second direction. In this case, the capping layer 120a may be further etched during a process for forming the gate electrode 130, e.g., a dry etching process. Thus, a further-etched capping layer 120b may be formed.

As described above, since the capping layer 120 is exposed to several etching processes, there is a strong likelihood that the capping layer 120 may be greatly damaged or completely removed.

Embodiments of the present invention may provide a FinFET using a semiconductor fin. In an exemplary embodiment, the semiconductor fin may include a top surface and a sidewall having different crystal planes. For example, when a silicon substrate is grown to have a plane {110}, an index system for a crystal plane in an active layout for forming the fin is set such that the sidewall of the fin has a plane {100}.

Hereinafter, crystallography will be briefly explained to facilitate an understanding of the embodiments of the present invention. In dealing with crystal structures, it is very useful to refer to a lattice plane or a lattice direction. In a notation used for describing a plane or a direction, a set of three integers is adopted to indicate the position of a plane or the direction of a vector in a lattice. Three integers used to describe a certain plane in a crystal lattice may be determined as set forth below.

At the outset, intersections at which the certain plane meets three crystal axes are found and expressed as integer-folds of a basic vector. In this case, the plane may move while leaving its orientation intact, until the intersections between the plane and the crystal axes are found. The reciprocals of the intersections are taken, and a set of three integers h, k, and l, which has the smallest ratio of integers, is obtained while maintaining the same relationships. The three integers h, k, and l may be expressed using round brackets ().

Figure 7:
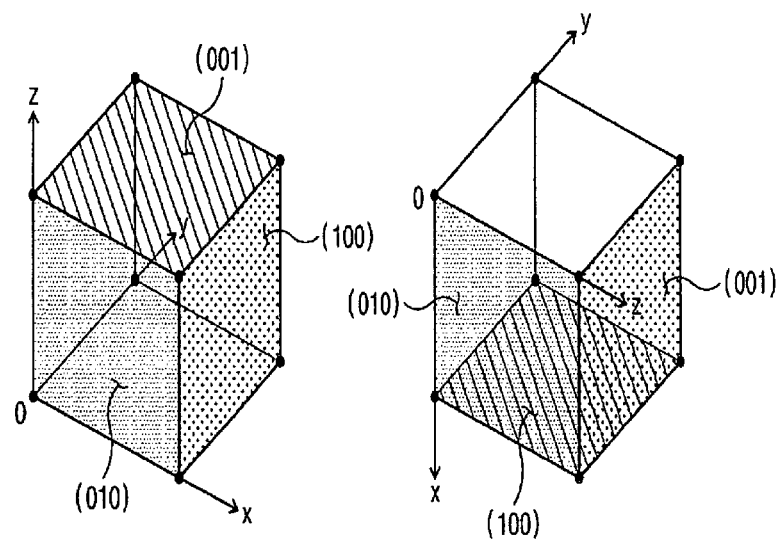
FIG. 7 illustrates equivalent crystal planes of a crystal plane {100} due to rotation of a lattice.

The set of three integers h, k, and l is referred to as a Miller index and used to define parallel planes in a lattice. From the standpoint of crystallography, many planes in a lattice are equivalent. In other words, a certain plane having a given Miller index may move in a lattice only according to a method of selecting the position and orientation of a unit cell. That is, planes, which are symmetric with respect to a crystal lattice axis, are called equivalent planes in the crystallographic aspect. The crystallographically equivalent planes are expressed using squiggled brackets { } instead of round brackets (). Thus, a crystal plane {100} includes three equivalent planes (100), (010), and (001). FIG. 7 illustrates the equivalent crystal planes (100), (010), and (001) of the crystal plane {100} due to rotation of a lattice.

Figure 8:
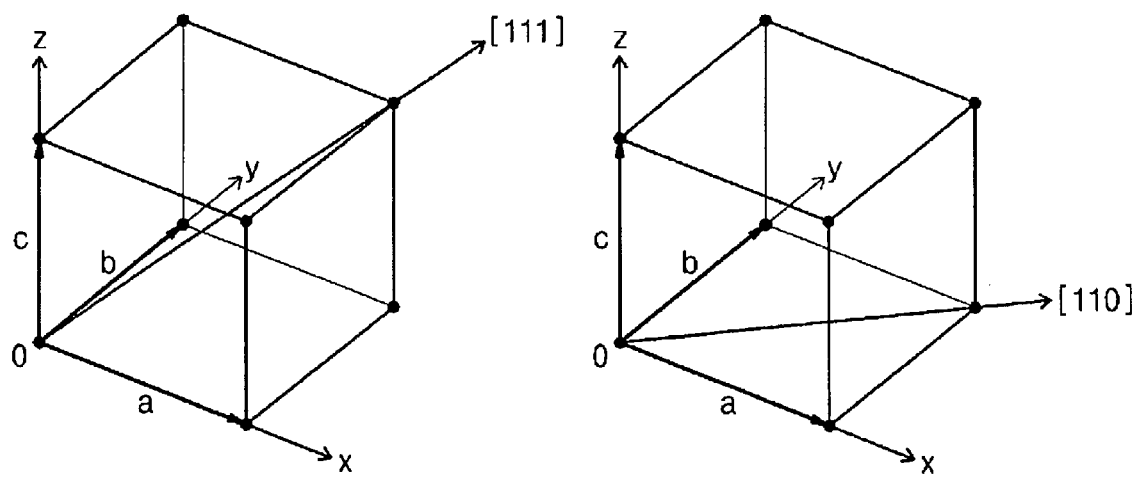
FIG. 8 illustrates the directions of lattices.

Meanwhile, a direction in a lattice is indicated as a set of three integers that have the same relationship as components of a vector having the direction. Three components of the vector are expressed as products of a basic vector, converted into the smallest ratio of integers, and expressed using square brackets [ ]. Like the lattice plane, many directions in a lattice are equivalent, and equivalent directions are expressed using angled brackets < >. For example, a direction <110> includes three crystallographically equivalent directions [100], [010], and [001]. FIG. 8 illustrates the directions of lattices. From FIGS. 7 and 8, it can be seen that a direction [hkl] is vertical to a crystal plane (hkl).

Figure 9:
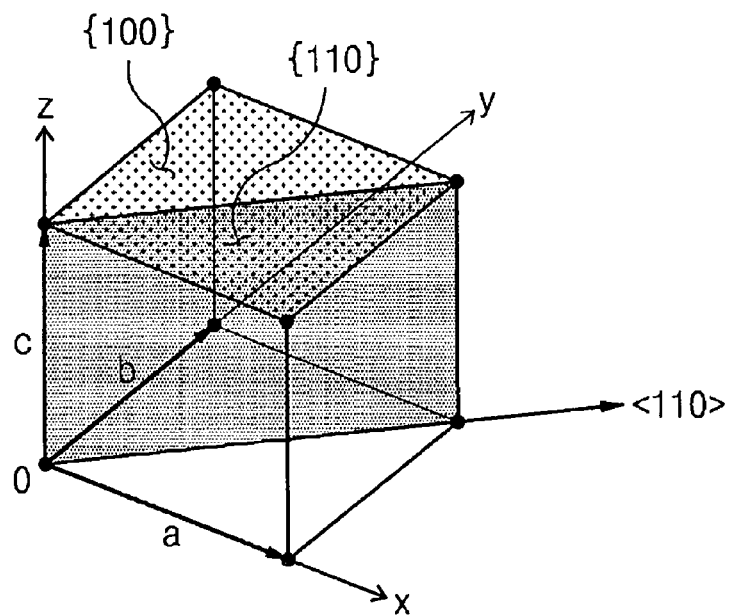
FIG. 9 illustrates crystal planes {100} and {110}, which are at right angles to each other.

Referring to FIG. 9, from the foregoing outline of crystallography, it can be seen that, for a cubic crystal, a crystal plane (001) is at a right angle to a crystal plane (110), which corresponds to a direction [110]. In other words, it can be seen that a crystal plane {100} is at a right angle to a crystal plane {110}, which corresponds to a direction <110>. Thus, when a substrate having a crystal plane {110} is etched in a direction <110>, the etched section of the substrate has the crystal plane {110}. Also, when a substrate having a crystal plane {111} is cut in a direction <100>, the cut section of the substrate has a crystal plane {100}. When a substrate having a crystal plane {111} is cut in a direction <110>, the cut section of the substrate has a crystal plane {110}.

Figure 10:
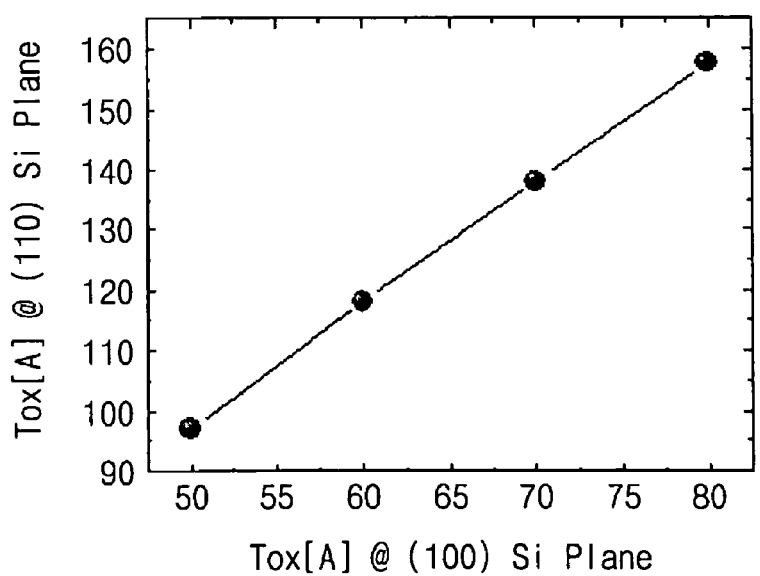
FIG. 10 illustrates a graph of the thicknesses of oxide layers formed on crystal planes {100} and {110} under the same thermal oxidation conditions.

FIG. 10 illustrates a graph of thicknesses of oxide layers formed on crystal planes {100} and {110} of a silicon crystal under the same thermal oxidation conditions. In FIG. 10, an abscissa denotes the thickness of a thermal oxide layer formed on the crystal plane {100}, and an ordinate denotes the thickness of a thermal oxide layer formed on the crystal plane {110}.

Based on the experimental results shown in FIG. 10, embodiments of the present invention may provide a semiconductor fin having different crystal planes. The different planes may have different atom densities, such that when a thermal oxidation process is performed under the same process conditions, thermal oxide layers having different thicknesses may be formed. In embodiments, a sidewall and a top surface of the semiconductor fin may have different crystal planes with different atom densities, so that a thermal oxide layer may be formed to different thicknesses on the sidewall and top surface of the semiconductor fin. For example, the sidewall of the semiconductor fin may have a crystal plane {100}, while the top surface of the semiconductor fin may have a crystal plane {110}. Accordingly, the thermal oxide layer may be grown to a thicker thickness on the crystal plane {110} than on the crystal plane {100}. In other words, a thick thermal oxide layer may be grown on the top surface having the crystal plane {110}, while a thin thermal oxide layer may be grown on the sidewall having the crystal plane {100}. Thus, a thick thermal oxide layer, which may replace the mask, may be formed without an additional process.

A substrate used for manufacturing a FinFET according to embodiments of the present invention may be a single crystalline bulk silicon substrate, which may be cut from a single crystalline silicon ingot formed using, for example, a Czochralski technique or a float zone growth technique, or a semiconductor substrate, which may include, e.g., an epitaxial layer, a buried oxide layer, and a doping region to improve characteristics and obtain a desired structure. In addition, the semiconductor substrate may be a silicon-on-insulator (SOI) substrate including a base substrate, a buried oxide layer, and a semiconductor substrate that are stacked sequentially.

FIGS. 11 through 20 illustrate perspective views of stages in a method of manufacturing a FinFET according to an exemplary embodiment of the present invention. In the current embodiment, a substrate may be a bulk silicon substrate including a silicon layer grown to have a crystal plane {110} or a SOI substrate.

Figure 11:
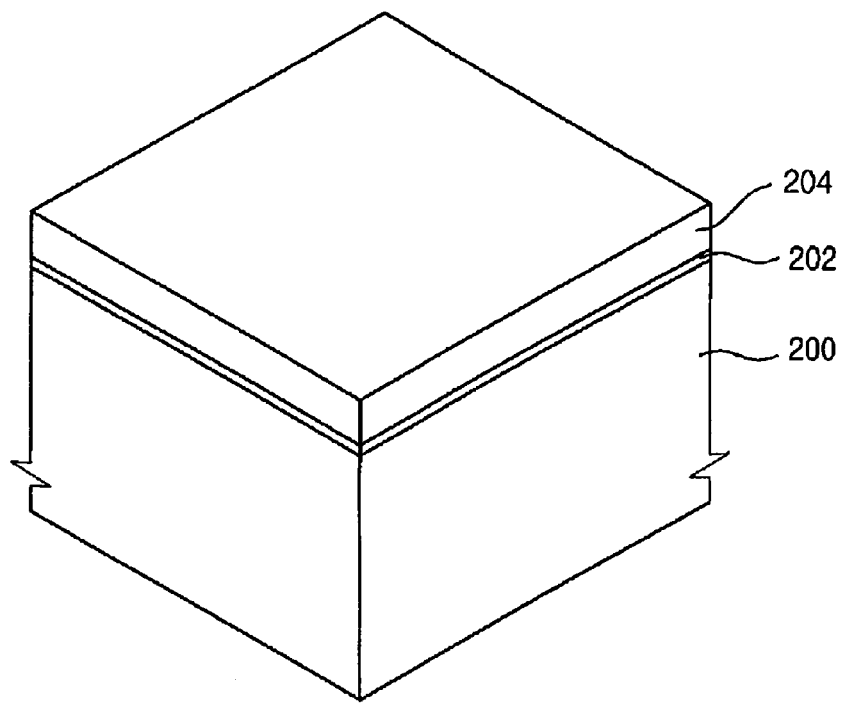
FIGS. 11 through 20 illustrate perspective views of stages of a method of manufacturing a FinFET according to an exemplary embodiment of the present invention.

Referring to FIG. 11, a first oxide layer 202 may be formed on a silicon substrate 200. The first oxide layer 202 may be obtained by oxidizing the surface of the silicon substrate 200 using, for example, a rapid thermal oxidation process, a furnace thermal oxidation process, or a plasma oxidation process. The first oxide layer 202 may be formed to a thickness of about 10 to 100 Å.

Thereafter, a hard mask layer and a silicon nitride layer 204 functioning as a capping layer may be formed on the first oxide layer 202. The silicon nitride layer 204 may be obtained by depositing silicon nitride on the first oxide layer 202 using, for example, a low-pressure CVD (LPCVD) technique.

Figure 12:
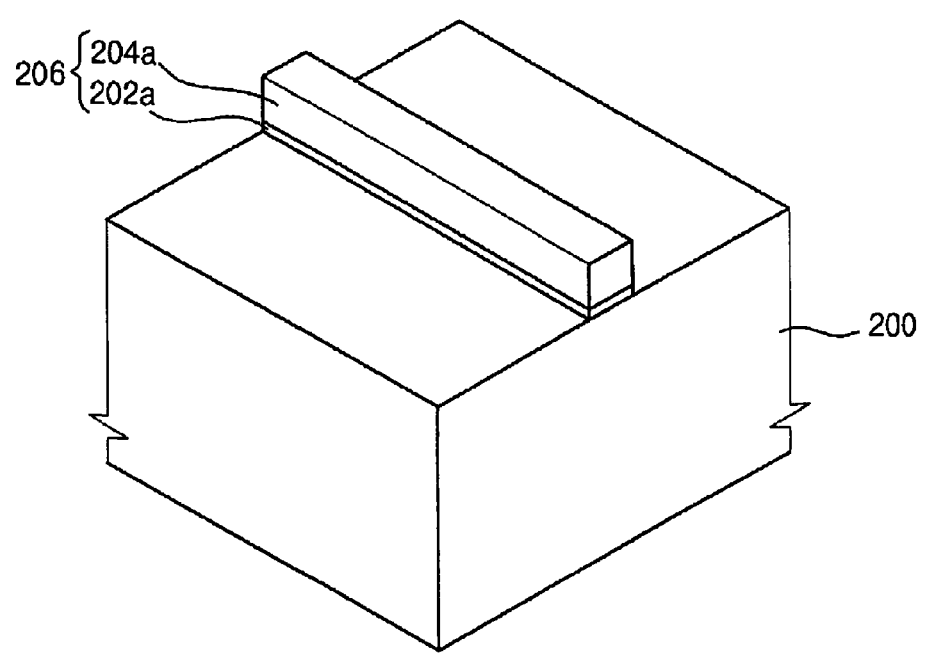

Referring to FIG. 12, photoresist (not shown) may be coated on the silicon nitride layer 204 and patterned using a photolithography process to form a photoresist pattern (not shown). The silicon nitride layer 204 and the first oxide layer 202 may be etched using the photoresist pattern as an etch mask, thereby forming an etch mask 206 including a silicon nitride layer pattern 204a and a first oxide layer pattern 202a. Thereafter, the photoresist pattern may be removed, e.g., using ashing, stripping, and cleaning processes. Patterning the silicon nitride layer 204 and the first oxide layer 202 may be performed using an active mask having a layout such that a sidewall of a fin has a crystal plane {100}, in order to induce a difference in oxide thickness with respect to a crystal plane during a subsequent process of forming a gate thermal oxide layer. That is, a direction of the etch mask 206 formed on the substrate 200 having the crystal plane {110} may be determined such that a lateral surface of the etched substrate corresponding to the sidewall of the fin has a crystal plane {100}.

Figure 13:
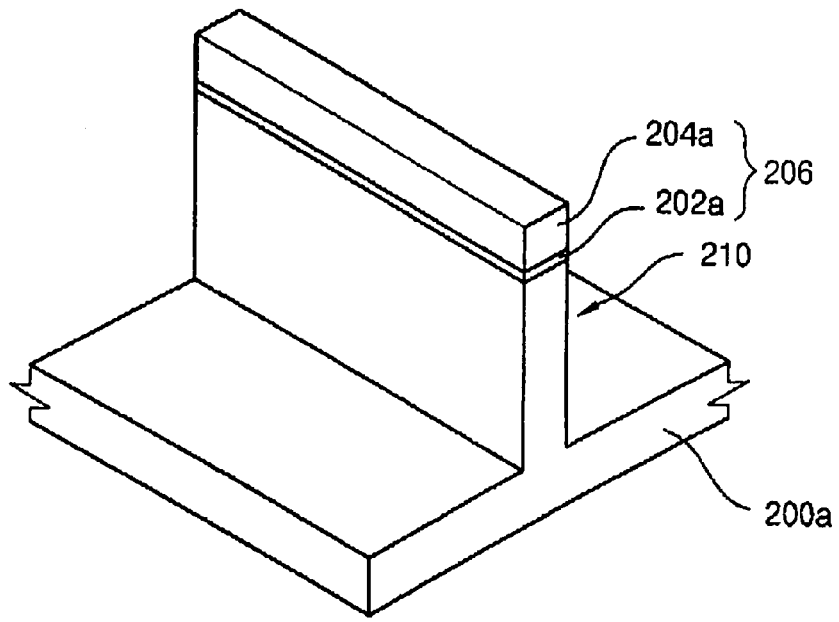

Referring to FIG. 13, the exposed silicon substrate 200 may be dry etched using the silicon nitride layer pattern 204a as an etch mask to form an active pattern 210. The active pattern 210 may protrude from the surface of an etched silicon substrate 200a and may extend across the etched silicon substrate 200a. The active pattern 210 may have a height of about 1500 to 4000 Å. The active pattern 210 may be referred to as a "fin." An orientation of the semiconductor substrate 200a may be set such that a top surface of the active pattern 210 has a plane (110) and a sidewall of the active pattern 210 has a plane (100).

Figure 14:
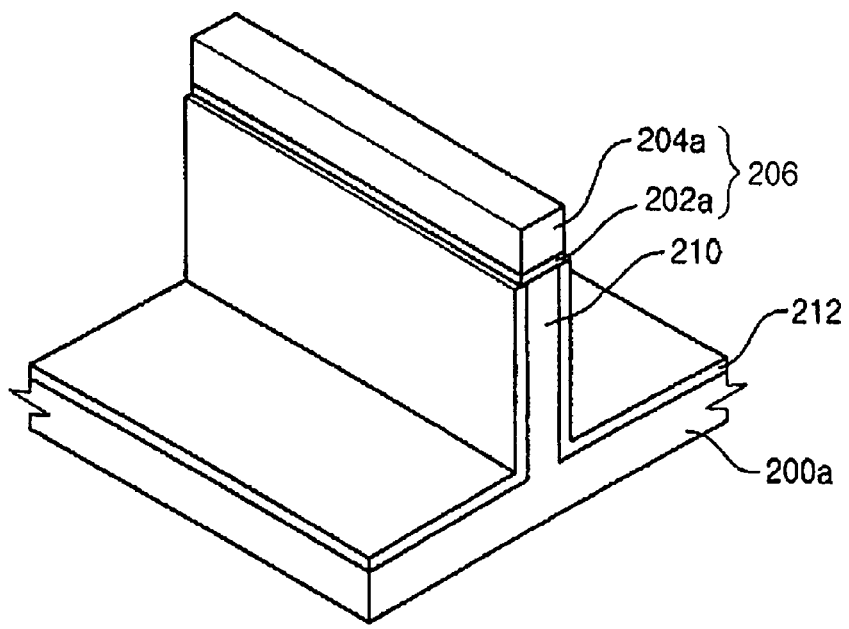

Referring to FIG. 14, in order to reduce stress applied to the sidewall of the active pattern 210 during the etching of the semiconductor substrate 200, a second oxide layer 212 may be sequentially formed on the surface of the silicon substrate 200a and the surface of the active pattern 210. The second oxide layer 212 may be obtained by oxidizing, e.g., using a rapid thermal oxidation process, a furnace thermal oxidation process, or a plasma oxidation process, the surfaces of the silicon substrate 200a and the active pattern 210. The second oxide layer 212 may be referred to as a "sidewall oxide layer."

Figure 15:
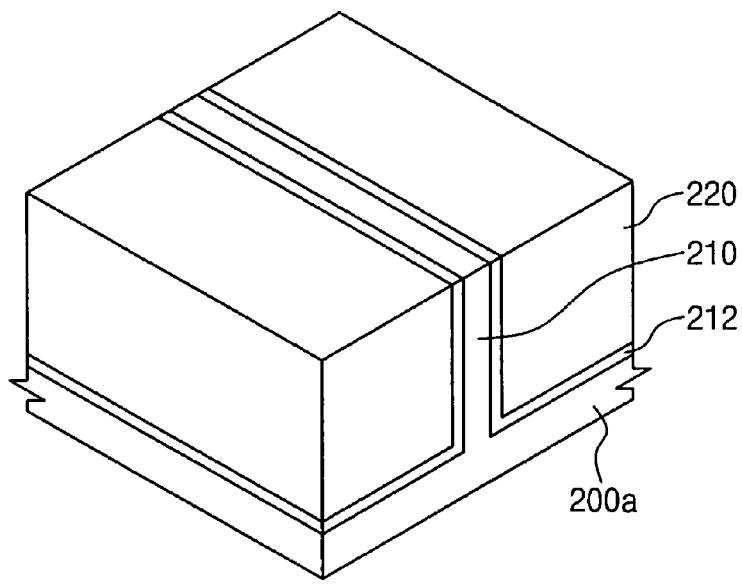

Referring to FIG. 15, after forming the active pattern 210, a dielectric layer (or a field oxide layer) may be formed to bury the active pattern 210 and then may be planarized. The dielectric layer may be formed, e.g., of a high-density plasma oxide or a spin-on-glass (SOG) material. The dielectric layer may be deposited to a thickness greater than the height of the active pattern 210. The dielectric layer may be planarized using a chemical mechanical polishing (CMP) process or an etchback process, thereby forming a dielectric layer pattern 220. Thereafter, the remaining etch mask 206, including the silicon nitride layer pattern 204a and the first oxide layer pattern 202a, may be removed, e.g., using an etching process, from the top surface of the active pattern 210.

Figure 16:
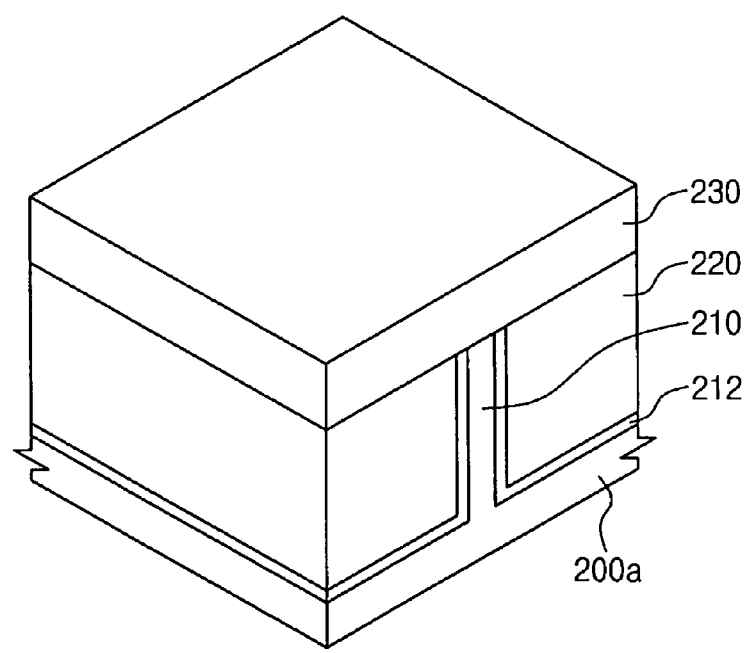

Referring to FIG. 16, a hard mask 230 may be formed on top of the active pattern 210 and the dielectric layer pattern 220. The hard mask 230 may be formed of a material having a high etch selectivity with respect to the dielectric layer pattern 220, for example, silicon nitride (SiN), polysilicon (poly-Si), or silicon oxynitride (SiON), or of a material having no etch selectivity with respect to the dielectric layer pattern 220. The hard mask 230 may be formed to a thickness of, for example, about 500 to 2000 Å.

Figure 17:
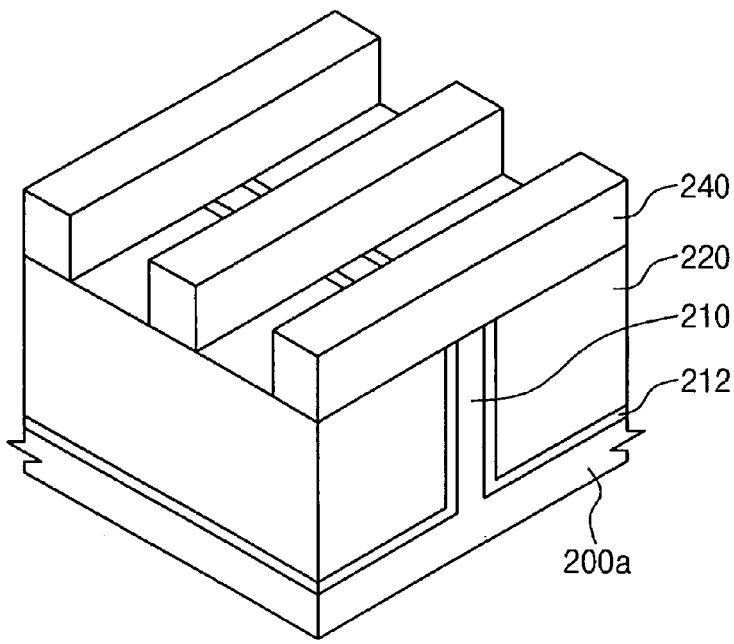

Referring to FIG. 17, in order to form a Damascene gate pattern, the hard mask 230 may be patterned using photolithographic and etching processes, thereby forming a hard mask pattern 240.

Figure 18:
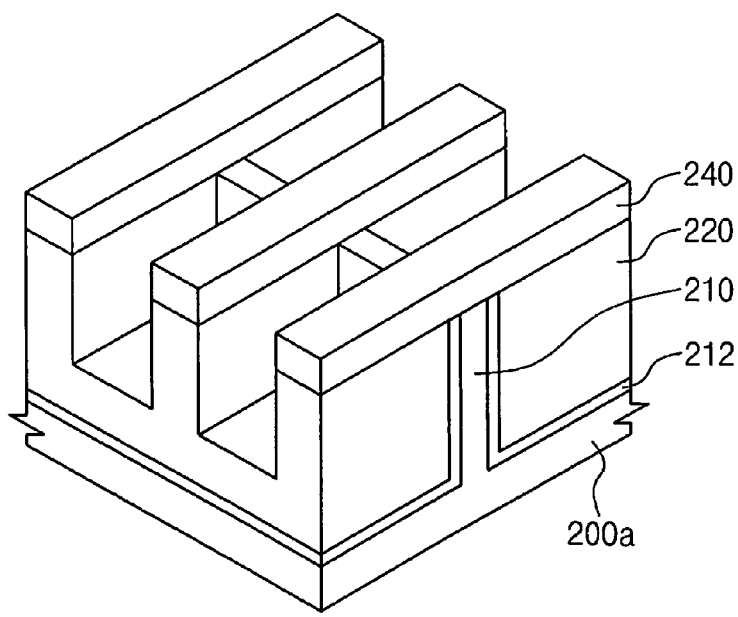

Referring to FIG. 18, the dielectric layer pattern 220 may be recessed to a predetermined depth using the hard mask pattern 240. For example, the dielectric layer pattern 220 may be recessed to a depth of about 500 to 1000 Å. When the hard mask pattern 240 is formed of a material having a high etch selectivity with respect to the dielectric layer pattern 220, for example, silicon nitride (SiN), polysilicon (poly-Si), or silicon oxynitride (SiON), only a small amount of the hard mask pattern 240 may be etched during the recessing of the dielectric layer pattern 220 due to the high etch selectivity. However, when the hard mask pattern 240 is formed of a material having no etch selectivity with respect to the dielectric layer pattern 220, the hard mask pattern 240 may be etched as much as the dielectric layer pattern 220 during the recessing of the dielectric layer pattern 220. Accordingly, the thickness of the hard mask pattern 240 may be substantially equal to or greater than the depth to which the dielectric pattern 220 is to be recessed.

Figure 19:
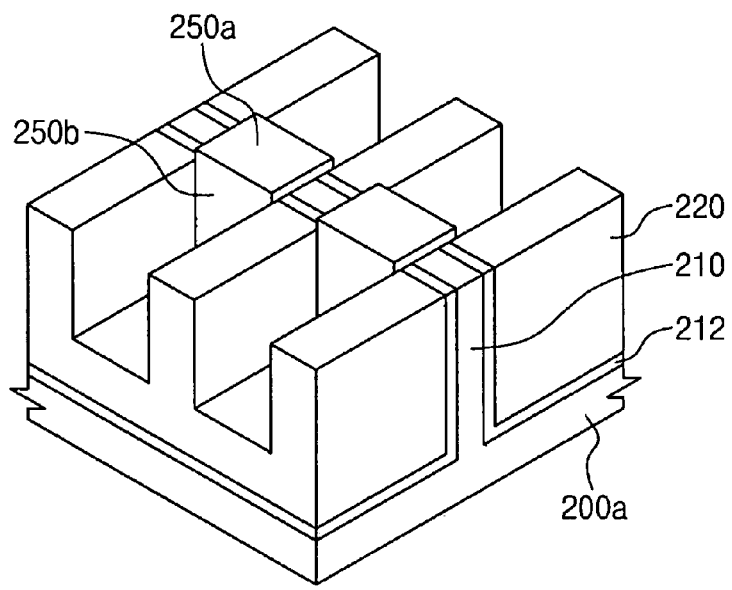

Referring to FIG. 19, any remaining portion of the hard mask pattern 240 may be removed, and gate dielectric layers 250a and 250b may be formed, e.g., using a thermal oxidation process, on the top and the sidewall, respectively, of the exposed active pattern 210. Since the top of the active pattern 210 has a crystal plane {110} and the sidewall of the active pattern 210 has a crystal plane {100}, the gate dielectric layer 250a formed on the top of the active pattern 210 is thicker than the gate dielectric layer 250b formed on sidewalls of the active pattern 210. The thermal oxidation process may be, e.g., a wet oxidation process, a dry oxidation process, etc.

Figure 20:
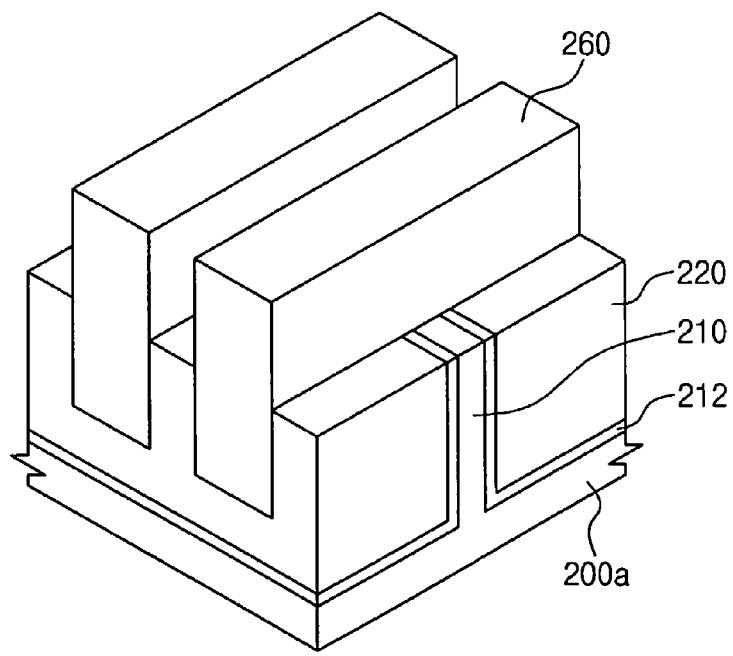

Referring to FIG. 20, a conductive material layer for a gate electrode may be deposited on exposed portions of the gate dielectric layers 250a and 250b. The conductive material layer may be patterned using photolithographic and etching processes to form a gate electrode 260.

Since the hard mask pattern 240 has been removed before the gate dielectric layers 250a and 250b are formed, a gate dielectric layer may also be formed on source and drain regions. Therefore, when forming the gate electrode 260, the gate dielectric layer formed on the source and drain regions may be removed, e.g., using an over-etching process.

The conductive material layer used for forming the gate electrode 260 may be a single layer or a stacked layer, and may include, e.g., N-type or P-type poly-Si, titanium nitride (TiN), tungsten (W), and tungsten nitride (WN). To form the gate electrode 260, the conductive material layer may be formed to a thickness greater than the height of the active pattern 210. Specifically, the conductive material layer may be formed to a thickness of about 500 to 2000 Å. Since subsequent processes are the same as processes for manufacturing an ordinary transistor, a description thereof will not be presented here.

Figure 21:
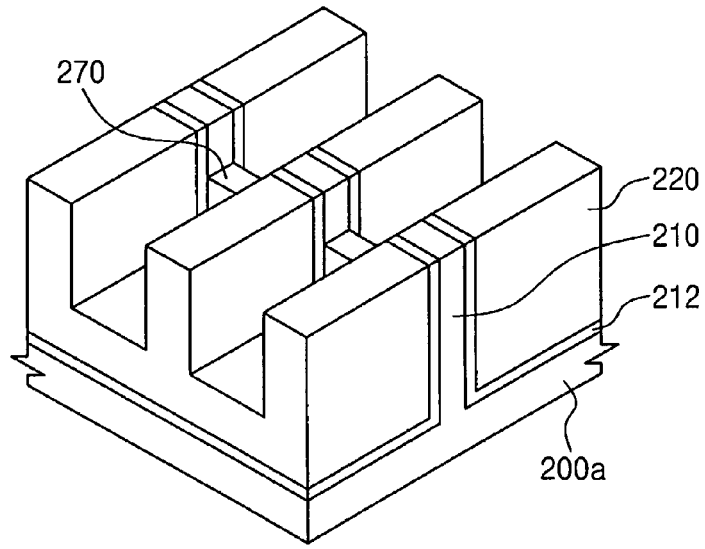
FIGS. 21 and 23 through 24 illustrates perspective views of stages of a method of manufacturing a FinFET according to another exemplary embodiment of the present invention.
Figure 23:
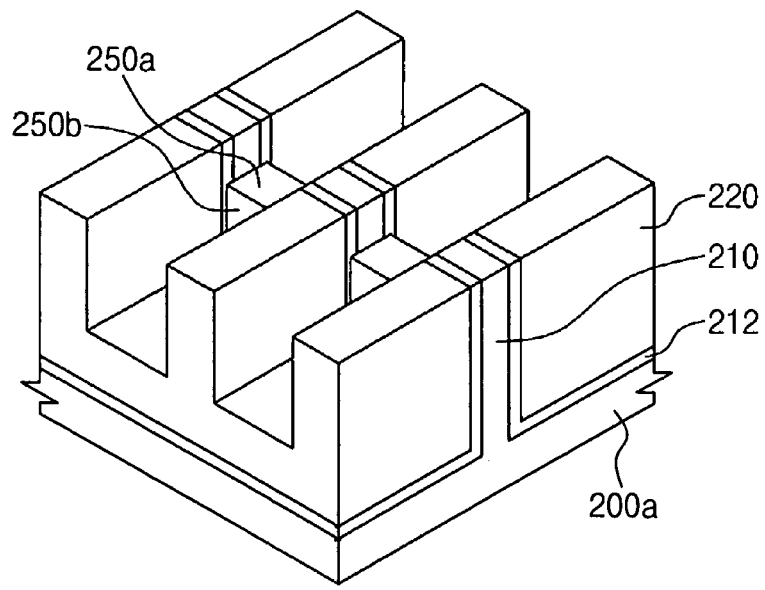
Figure 24:
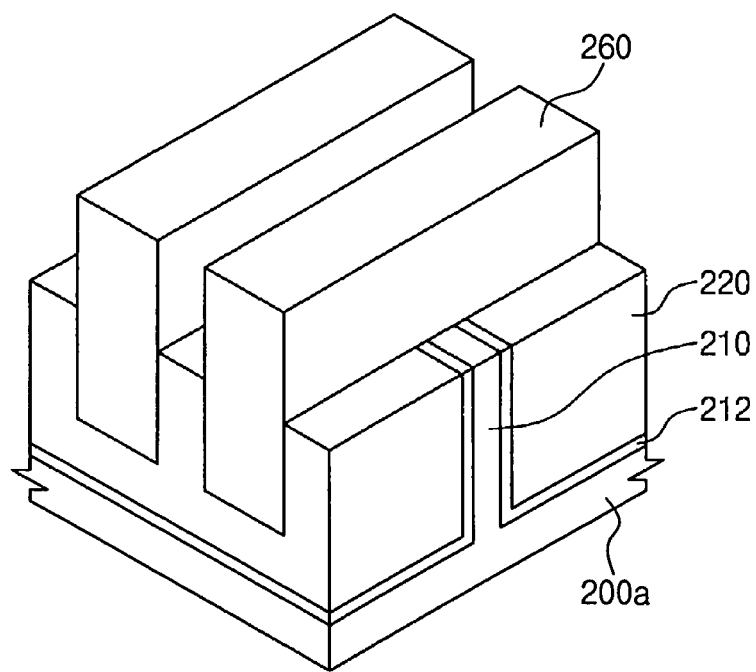

FIGS. 21 and 23 through 24 illustrate diagrams of stages in a method of manufacturing a FinFET according to another exemplary embodiment. In the current embodiment, a substrate may be a bulk silicon substrate or a SOI substrate including a silicon layer grown to have a crystal plane {110}.

The current embodiment is a variation of the previous embodiment described with reference to FIGS. 11 through 20. Thus, since the processes performed up until recessing a dielectric layer pattern 220 using a hard mask pattern 240, as described with reference to FIGS. 11 through 18, are the same as the processes of the previous embodiment, the description will begin with subsequent processes.

Referring to FIG. 21, the dielectric layer pattern 220 may be recessed using the hard mask pattern 240 as described with reference to FIG. 18, and the active pattern 210 may also be recessed to a predetermined depth to form a recessed lateral surface 270. When the active pattern 210 is recessed using a process incorporating a low etch selectivity between silicon and a dielectric layer, the dielectric layer pattern 220 may be further recessed. In this case, when the active pattern 210 has a recessed depth of about 500 to 1500 Å, the firstly recessed depth and further recessed depth of the dielectric layer pattern 220 may sum up to about 800 to 2500 Å. Thus, a step difference between the recessed active pattern 210 and the recessed dielectric layer pattern 220 may range from about 300 to 1000 Å.

Alternatively, when the active pattern 210 is recessed using a process incorporating a high etch selectivity between silicon and a dielectric layer, the recessed depth of the active pattern 210 may be higher than the recessed depth of the dielectric layer pattern 220 in order to expose the sidewall of the active pattern 210. In this case, the recessed depth of the active pattern 210 may be controlled such that a step difference between the recessed active pattern 210 and the recessed dielectric layer pattern 220 may range from about 300 to 1000 Å. In both cases, the dielectric layer pattern 220 may be recessed to a greater depth than the active pattern 210.

Figure 22:
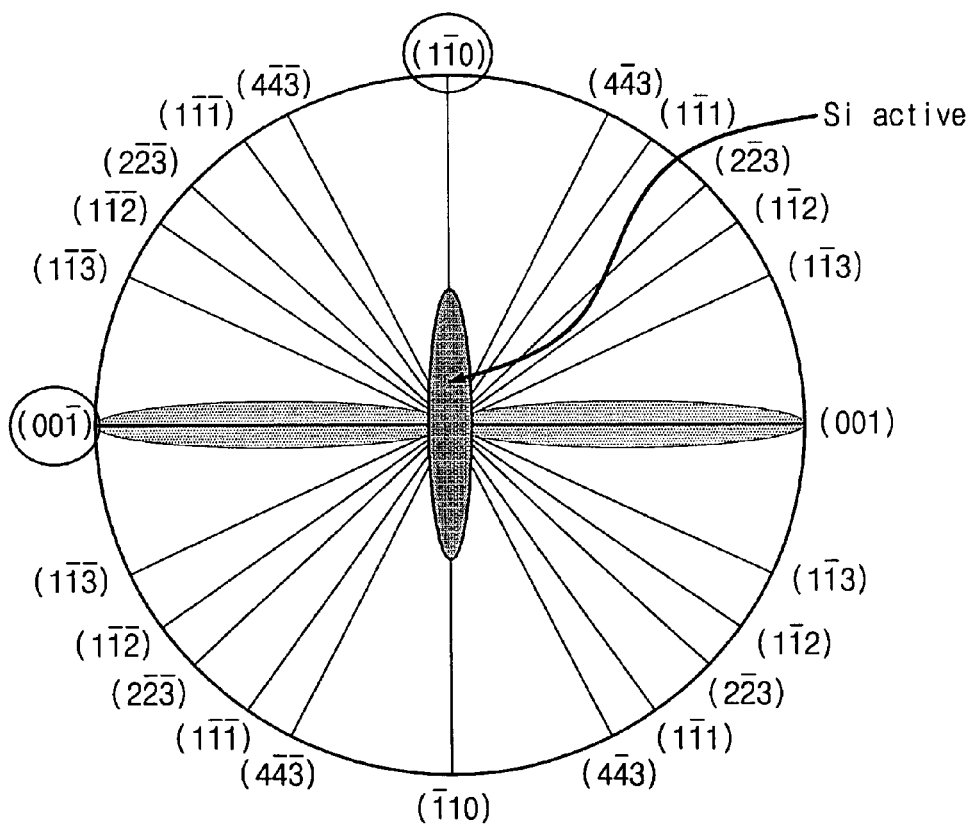
FIG. 22 illustrates a stereogram of a substrate to be used in the method of FIGS. 21 and 23 through 24.

As can be seen from the stereogram in FIG. 22, when a top of the active pattern 210 (i.e., the fin) has a crystal plane {110}, and a sidewall of the active pattern 210 has a crystal plane {100}, the recessed lateral surface 270 may have a crystal plane {110}, which is crystallographically vertical to the crystal plane {100} of the sidewall of the active pattern 210, In another implementation, the recessed lateral surface 270 may form an acute angle with the crystal plane {100} of the sidewall of the active pattern 210 according to recessing conditions. When the recessed lateral surface 270 forms an acute angle with the sidewall of the active pattern 210, the recessed silicon lateral surface 270 may have one of crystal planes {111} and {113} between the crystal planes {100} and {110}. Since the crystal planes {111} and {113} are higher index planes than the crystal plane {100}, a thick oxide layer may be formed on the recessed lateral surface 270 during a subsequent thermal oxidation process.

Referring to FIG. 23, the hard mask pattern 240 may be removed, and gate dielectric layers 250a and 250b may be respectively formed on a top and sidewall of the exposed active pattern 210 using a thermal oxidation process. The thermal oxidation process may be, e.g., a wet oxidation process and a dry oxidation process. When the top of the active pattern 210 has the crystal plane {110} and sidewalls of the active pattern 210 have the crystal plane {100}, the thickness of oxide (Tox) is thicker on the top of the active pattern 210 having the crystal plane {110} than on sidewalls of the active pattern 210 having the crystal plane {100}. Also, when the recessed silicon lateral surface 270 has the crystal plane {110} vertical to the crystal plane {100} of sidewalls of the active pattern 210 or forms an acute angle with the crystal plane {100} of sidewalls of the active pattern 210 due to the crystallographic relationship described with reference to FIG. 22, the thickness of oxide (Tox) is thicker on the recessed silicon lateral surface 270 having any crystal plane than on the sidewalls of the active pattern 210 having the crystal plane {100}.

Referring to FIG. 24, a gate electrode 260 may be formed in the same manner as described with reference to FIG. 20. As described above, the embodiments of the present invention may provide a FinFET that may maintain a reliable capping layer and an active interval. Generally, at least one or more of these features may be realized by orienting a top surface of the semiconductor fin on a first crystal plane (abc) and a sidewall of the semiconductor fin on a second crystal plane (hkl), wherein a, b, and c are integers that are not all zero, h, k, and l are integers that are not all zero, and a set of a, b, and c has at most two integers in common with a set of h, k, and l.

In a FinFET according to embodiments of the present invention, an electric field may be weakly applied from a gate electrode to the top of a fin on which a thick thermal oxide layer is formed, while the electric field may be strongly applied from the gate electrode to the sidewalls of the fin on which a thin thermal oxide layer is formed. Due to a difference between the electric fields applied to the top and sidewalls of the fin, the formation of a channel and a threshold voltage depend on a electric field applied to the sidewall of the fin. Therefore, a drop in the threshold voltage and the resultant degradation of the electrical characteristics of the FinFET may be effectively reduced or prevented, in contrast to a conventional FinFET in which the thickness of oxide (Tox) formed on the top of a fin is the same as that formed on the sidewall thereof.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a semiconductor device, comprising:
    forming a semiconductor fin having a top surface and a sidewall, the top surface having a crystal plane {110} and the sidewall having a crystal plane {100};
    forming a dielectric layer pattern extending along the semiconductor fin;
    forming a gate dielectric layer including a first portion on the sidewall of the semiconductor fin and a second portion on the top surface of the semiconductor fin simultaneously, such that the second portion is thicker than the first portion; and
    forming a gate electrode on the first and second portions, a lowermost surface of the gate electrode being lower than an uppermost surface of the dielectric layer pattern; wherein:
    forming the first and second portions includes:
        forming a mask pattern on the dielectric layer pattern and the top surface of the semiconductor fin to define a line region where a gate electrode will be formed, the line region being substantially perpendicular to the semiconductor fin;
        partially etching the exposed dielectric layer pattern using the mask pattern as an etch mask to expose the sidewall of the semiconductor fin; and
        thermally oxidizing the top surface and sidewall of the semiconductor fin having the different crystal planes.

2. The method as claimed in claim 1, wherein forming the semiconductor fin comprises:
    preparing a semiconductor substrate having a crystal plane {110}; and
    etching the semiconductor substrate to create the sidewall of the semiconductor fin having a crystal plane {100}, wherein the dielectric layer pattern defines an active region on the semiconductor substrate.

3. The method as claimed in claim 1, wherein partially etching the exposed dielectric layer pattern using the mask pattern as the etch mask comprises partially etching the semiconductor fin to reduce a height of the semiconductor fin where the gate electrode is to be formed.

4. A method of manufacturing a semiconductor device, comprising:
    etching a semiconductor substrate to form a semiconductor fin having a top surface and a sidewall, the top surface having a crystal plane {110} and the sidewall having a crystal plane {100};
    forming a dielectric layer pattern extending along the semiconductor fin;
    thermally oxidizing the semiconductor substrate to form a first thermal oxide layer on the sidewall of the semiconductor fin and to form a second thermal oxide layer on the top surface of the semiconductor fin, such that the second thermal oxide layer is thicker than the first thermal oxide layer; and
    forming a gate electrode on the first and second thermal oxide layers, wherein:
    the first thermal oxide layer and the second thermal oxide layer are simultaneously formed; and
    forming the first and second thermal oxide layers includes:
        forming a mask pattern on the dielectric layer pattern and the top surface of the semiconductor fin to define a line region where a gate electrode will be formed, the line region being substantially perpendicular to the semiconductor fin,
        partially etching the exposed dielectric layer pattern using the mask pattern as an etch mask to expose the sidewall of the semiconductor fin; and
        thermally oxidizing the top surface and sidewall of the semiconductor fin having the different crystal planes.

5. The method as claimed in claim 4, further comprising, before forming the gate electrode, reducing a height of the semiconductor fin where the gate electrode is to be formed.

6. A method of manufacturing a semiconductor device, comprising:
    etching a semiconductor substrate to form a semiconductor fin extending in a first direction and having a top surface and a sidewall, the top surface having a crystal plane{110} and the sidewall having a crystal plane {100};

forming a dielectric layer pattern defining an active region of the substrate;

planarizing the dielectric layer pattern to expose the top surface of the semiconductor fin;

forming a first mask pattern extending in a second direction crossing the first direction to define a line region where a gate electrode will be formed, the line region being substantially perpendicular to the semiconductor fin;

removing a portion of the dielectric layer pattern according to the mask pattern to expose a portion of the sidewall of the semiconductor fin;

thermally oxidizing the top surface and sidewall of the semiconductor fin having the different crystal planes to form a first thermal oxide layer on the sidewall of the semiconductor fin and a second thermal oxide layer on the top surface of the semiconductor fin simultaneously, such that the second thermal oxide layer is thicker than the first thermal oxide layer; and forming a gate electrode to fill the removing portion of the dielectric layer pattern, the gate electrode extending in the second direction.

7. The method as claimed in claim 6, wherein etching the semiconductor substrate comprises forming a second mask pattern on the semiconductor substrate.

8. The method as claimed in claim 7, wherein planarizing the dielectric layer pattern comprises removing the second mask pattern to expose the top surface of the semiconductor fin.

9. The method as claimed in claim 6, wherein an uppermost surface of the dielectric layer pattern is coplanar with the top surface of the semiconductor fin.

10. The method as claimed in claim 6, wherein a lowermost surface of the gate electrode is lower than an uppermost surface of the dielectric layer pattern.

11. The method as claimed in claim 6, further comprising forming a second oxide layer between the semiconductor fin and the dielectric layer pattern.

12. The method as claimed in claim 6, further comprising recessing the exposed portion of the semiconductor fin to reduce a height of the semiconductor fin before thermally oxidizing the semiconductor substrate.

13. The method as claimed in claim 12, wherein recessing the exposed portion of the semiconductor fin comprises recessing the dielectric layer pattern using a low etch selectivity etchant.

* * * * *